United States Patent [19]

Kiikuniya et al.

[11] Patent Number: 4,721,944
[45] Date of Patent: Jan. 26, 1988

[54] ANALOG-TO-DIGITAL CONVERSION METHOD AND AN ANALOG-TO-DIGITAL CONVERTER UTILIZING THE SAME

[75] Inventors: Masumi Kiikuniya; Mamoru Maekawa, both of Kanagawa; Shinichi Mori, Yokohama, all of Japan

[73] Assignee: Yamatake-Honeywell Co. Ltd., Tokyo, Japan

[21] Appl. No.: 887,855

[22] Filed: Jul. 21, 1986

[30] Foreign Application Priority Data

Jul. 31, 1985 [JP] Japan .................................. 60-167491

[51] Int. Cl.⁴ .............................................. H03M 1/12
[52] U.S. Cl. ............................. 340/347 CC; 364/577; 340/347 AD
[58] Field of Search .................. 340/347 CC, 347 AD; 364/571, 577

[56] References Cited

U.S. PATENT DOCUMENTS 4,300,203 11/1981 Brown .................................. 364/577
4,338,589 7/1982 Engel ............................ 340/347 CC
4,364,027 12/1982 Murooka ....................... 340/347 CC

OTHER PUBLICATIONS

Gutman, "EDN", Jan. 5, 1979, pp. 58, 61, 62.

Primary Examiner—Charles D. Miller
Attorney, Agent, or Firm—Mitchell J. Halista; Albin Medved

[57] ABSTRACT

An A/D conversion method including the steps of storing digital voltage values obtained through an A/D conversion of divided voltages obtained by dividing an analog voltage in a predetermined voltage range into a predetermined number of different dividing ratios by an A/D converter and digital data for calculating digital output data for the A/D conversion of an input voltage in combination with the digital voltage values in a memory, converting the input voltage into a corresponding digital input value through A/D conversion, deciding upon a voltage division including the digital input value among divisions demarcated by the digital voltage values by sequentially comparing the digital voltage values with the digital input value, deciding which of a pair of the digital voltage values demarcating the division selected through the prior decision is the approximate value of the digital input value, updating the divided voltage corresponding to the digital voltage value through A/D conversion to provide a representative demarcating value, deciding upon a division including the digital input value by comparing the updated representative demarcating value and the digital input value to update one of the divided voltages corresponding to one of the demarcating values paired with the representative demarcating value through A/D conversion and providing a digital signal corresponding to a digital output value through linear interpolation on the basis of the digital input value, the updated demarcating value, and an appropriate data corresponding to the updated demarcating value of the selected division among the digital data and an A/D converter utilizing the above method.

5 Claims, 7 Drawing Figures

ANALOG-TO-DIGITAL CONVERSION METHOD AND AN ANALOG-TO-DIGITAL CONVERTER UTILIZING THE SAME

BACKGROUND OF THE INVENTION

1. Field of the Invention

The present invention relates to analog-to-digital converters. More specifically, the present invention is directed to an analog-to-digital (A/D) conversion method employing linear interpolation and an A/D converter using the A/D conversion method.

2. Description of the Prior Art

A/D converters have been widely used in the fields of measurement and control. Recent practical application of A/D converters particularly to digital audio apparatus requires A/D converters having particularly high accuracy and resolution. The successive comparison A/D converter is one of such high accuracy A/D converters. The successive comparison A/D converter samples and holds input signals and provides digital output signals sequentially to a digital-to-analog converter (hereinafter referred to as "D/A converter"). An analog output signal provided by the D/A converter is compared with the sampled and held input signals by a comparator, and a digital signal corresponding to the analog output signal provided by the D/A converter is provided as a converter digital output signal upon the inversion of the output of the comparator. This A/D convertor is complicated in constitution and very expensive due to the employment of the D/A converter. An A/D converter using the charging and discharging of a condenser for A/D conversion, as a so-called single slope A/D converter, is, on the other hand, one of the inexpensive conventional A/D converters. Although such a single slope A/D converter has high resolution, it is not satisfactory in linearity between an analog input and a digital output, i.e., an actual input-output curve showing the relation between an analog input and a corresponding digital output deviates from a straight line showing an ideal input-output relation due to an inaccurate, i.e., non linear, A/D conversion. The non-linearity of the output characteristics of that A/D converter is attributable, for example, to offset error and/or gain error. It is possible to reduce offset error and gain error to zero in order to minimize the nonlinearity. However, even if the offset error and the gain error are reduced to zero, the input-output characteristics of the A/D converter will still not be the ideal straight line. Thus, it is difficult to improve the linearity of that A/D converter to a satisfactory extent, and the improvement of the circuit constitution of that A/D converter to correct the linearity to a satisfactory extent entails an increase in the cost of that A/D converter and a complication of the circuit.

SUMMARY OF THE INVENTION

It is an object of the present invention to provide an improved A/D conversion method.

It is another object of the present invention to provide an A/D converter utilizing the method.

In accomplishing these and other objects, there has been provided, in accordance with the present invention, an A/D conversion method including the steps of storing digital voltage values obtained through an A/D conversion of divided voltages obtained by dividing an analog voltage in a predetermined voltage range into a predetermined number of different dividing ratios by an A/D converter and digital data for calculating digital output data for the A/D conversion of an input voltage in combination with the digital voltage values in a memory converting the input voltage into a corresponding digital input value through A/D conversion, deciding upon a voltage division including the digital input value among divisions demarcated by the digital voltage values by sequentially comparing the digital voltage values with the digital input value, deciding which of a pair of the digital voltage values demarcating the division selected through the prior decision is the approximate value of the digital input value, updating the divided voltage corresponding to the digital voltage value through A/D conversion to provide a representative demarcating value, deciding upon a division including the digital input value by comparing the updated representative demarcating value and the digital input value to update one of the divided voltages corresponding to one of the demarcating values paired with the representative demarcating value through A/D conversion and providing a digital signal corresponding to a digital output value through linear interpolation on the basis of the digital input value, the updated demarcating value, and an appropriate data corresponding to the updated demarcating value of the selected division among the digital data and an A/D converter utilizing the above method. An A/D converter utilizing this method includes a voltage dividing means which divides an analog voltage in a predetermined range in a predetermined number of different dividing ratios and provides divided output voltages, switch means which provides one of the divided voltages in response to a selection signal, A/D conversion means which converts the analog voltage provided by said switch means into a corresponding digital voltage, switch selecting means for providing the selection signal, memory means for previously storing digital data proportionally corresponding to the divided voltages, respectively, and digital values obtained through the A/D conversion of the divided voltages by said A/D conversion means, memory control means connected to the input side of said switch selecting means, the output side of said A/D conversion means and said memory means, and capable of reading data from said memory means and storing data in said memory means, comparing means connected to said switch selecting means and said memory control means, and capable of selecting a division including the digital input value among divisions demarcated by the digital values by comparing a digital input value obtained through the A/D conversion of the input voltage, and the digital value in magnitude, and capable of deciding which of the upper and lower demarcating values of the selected division is the approximate value of the digital input value, division deciding means connected to said switch selecting means and said memory control means, and capable of deciding a division including the digital input value by comparing the updated demarcating value obtained through A/D conversion by said A/D conversion means on the basis of the prior decision, and arithmetic means connected to said memory control means, and capable of providing a digital signal corresponding to a digital output value corresponding to the digital value, calculated through linear interpolation on the basis of a pair of the updated demarcating values of the selected division, and data corresponding to the digital data corresponding to the updated demarcating values.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

The method of the invention is achieved by storing digital voltage values obtained through the A/D conversion of divided voltages obtained by dividing an analog voltage in a predetermined range in a predetermined number of different dividing ratios by a built-in A/D converter, and digital data for calculating digital output data for the A/D conversion of an input voltage in coordination with the digital value in a memory converting the input voltage into a corresponding digital input value through A/D conversion deciding a devision including the digital input value among divisions demarcated by the digital voltage values by sequentially comparing the digital voltage values with the digital input value, deciding which of a pair of the digital voltage values demarcating the division selected through the prior decision is the approximate value of the digital input value, updating the divided voltage corresponding to the digital voltage value through A/D conversion to provide a representative demarcating value, deciding a division including the digital input value by comparing the updated representative demarcating value and the digital input value to update one of the divided voltages corresponding to one of the demarcating values paired with the representative demarcating value through A/D conversion, and providing a digital signal corresponding to a digital output value through linear interpolation on the basis of the digital input value, the updated demarcating value, and an appropriate data corresponding to the updated demarcating value of the selected division among the digital data.

An A/D converter utilizing the above method comprises voltage dividing means which divides an analog voltage in a predetermined range in a predetermined number of different dividing ratios and provides divided voltages, switch means which provides one of the divided voltages upon the receiption of a selection signal, A/D conversion means which converts the analog voltage provided by the switch means into a corresponding digital voltage, switch selecting means which provides the selection signal, memory means previously storing digital data proportionally corresponding to the divided voltages, respectively, and digital values obtained through the A/D conversion of the divided voltages by the A/D conversion means, in coordination, memory control means connected to the input side of the switch selecting means, the output side of the A/D conversion means and the memory means, and capable of reading data from the memory means and storing data in the memory means, comparing means connected to the switch selecting means and the memory control means, and capable of selecting a division including the digital input value among divisions demarcated by the digital values by comparing a digital input value obtained through the A/D conversion of the input voltage and the digital value, in magnitude, and capable of deciding which of the upper and lower demarcating values of the selected division is the approximate value of the digital input value, division deciding means connected to the switch selecting means and the memory control means, and capable of deciding a division including the digital input value by comparing the updated demarcating value obtained through A/D conversion by the A/D conversion means on the basis of the prior decision, and arithmetic means connected to the memory control means, and capable of providing a digital signal corresponding to a digital output value corresponding to the digital value, calculated through linear interpolation on the basis of a pair of the updated demarcating values of the selected division, and a data corresponding to the digital data corresponding to the updated demarcating values.

Figure 1:
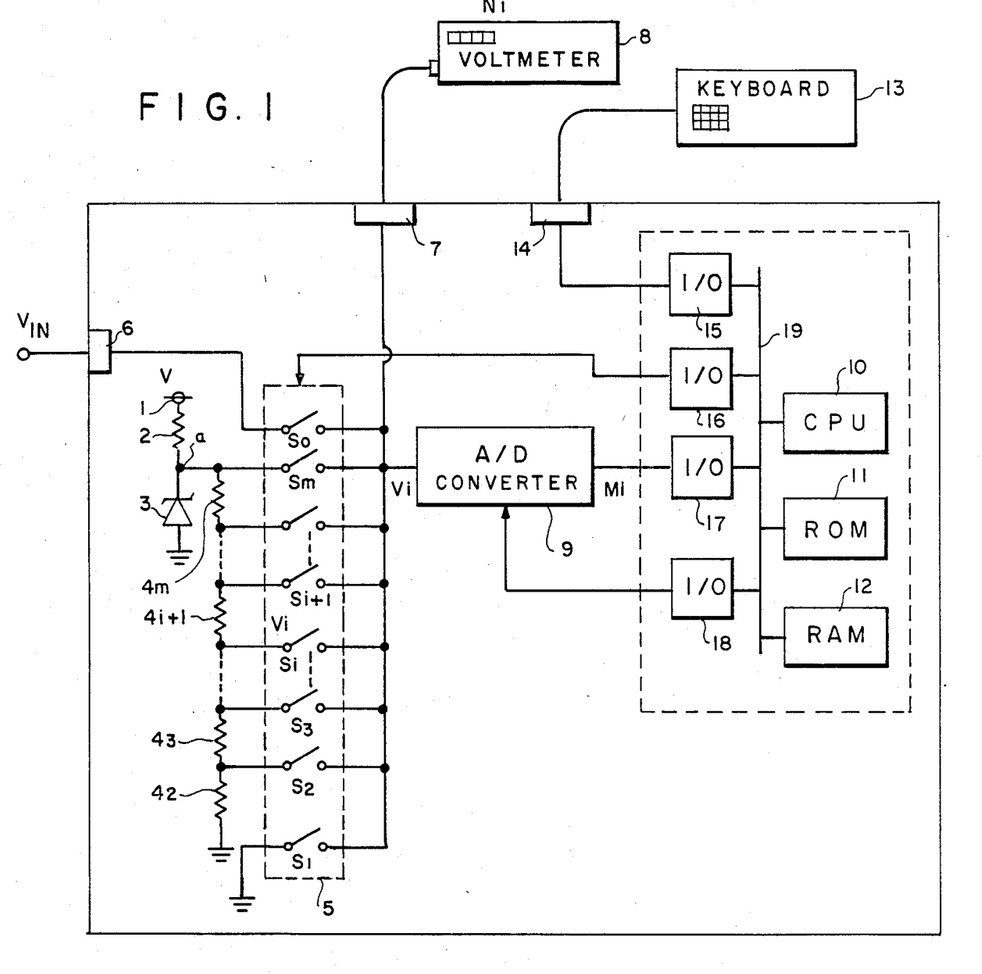
FIG. 1 is a block diagram showing an example of a converter system using a first embodiment of the present invention.

Referring to FIG. 1 in more detail there is shown an A/D converter system having a series connection of a power source 1, a resistor 2, and a zener diode 3. The series connection of the resistor 2 and the zener diode 3 is connected between one output side of the power source 1 and a common ground. A junction "a" of the resistor 2 and the zener diode 3 is held at a fixed potential $V_z$. A plurality of dividing resistors $4_2$, $4_3$, ... and $4_m$ each having substantially the same resistance, respectively, are connected in series between the junction "a" and the ground. The resistances of the resistors $4_2$, $4_3$, ... and $4_m$ need not necessarily be identically the same. An analog multiplexer 5 comprises a plurality of internal switches $S_0$, $S_1$, $S_2$, ... $S_m$. One terminal of the switch $S_0$ is connected to an input terminal 6 for receiving an analog signal to be converted, namely, an input voltage $V_{in}$, one terminal of the switch $S_1$ is grounded, and the remaining switches $S_2$, $S_3$ ... and $S_m$ each have one terminal connected to the high tension sides of the dividing resistors $4_2$, $4_3$ ... and $4_m$, respectively. The other terminals of the switches $S_0$, $S_1$, $S_2$ ... and $S_m$ are connected to the common output terminal of the multiplexer 5. An output terminal 7 is used for an adjustment mode wherein a voltmeter 8 is connected in the adjustment mode. An A/D converter 9 which is unsatisfactory in the linearity of its A/D conversion has its input connected to the output terminal 7 and the output side of the multiplexer 5. A central processing unit 10 (hereinafter abbreviated to "CPU") operates according to routines stored in a read-only memory 11 (hereinafter abbreviated to "ROM"). In FIG. 1, there is also shown a random access memory 12 (hereinafter abbreviated to "RAM") backed up by a battery to store data for the operation of the CPU 10, a keyboard 13 for supplying data to the system circuit in the adjustment mode, and an input terminal 14 to which the keyboard 13 is connected in the adjustment mode. An I/O port 15 receives data provided by the keyboard 13 through the input terminal 14, an I/O port 16 passes switch selecting signals to the multiplexer 5 for selecting the switches $S_0$, $S_1$, $S_2$ ... and $S_m$, an I/O port 17 receives the output signal of the A/D converter 9, and an I/O port 18 passes an A/D conversion command signal to the A/D converter 9. The CPU 10, the ROM 11, the RAM 12 and the I/O ports 15, 16, 17 and 18 are interconnected by a signal bus 19 or the like to constitute a signal processing unit.

Figure 2:
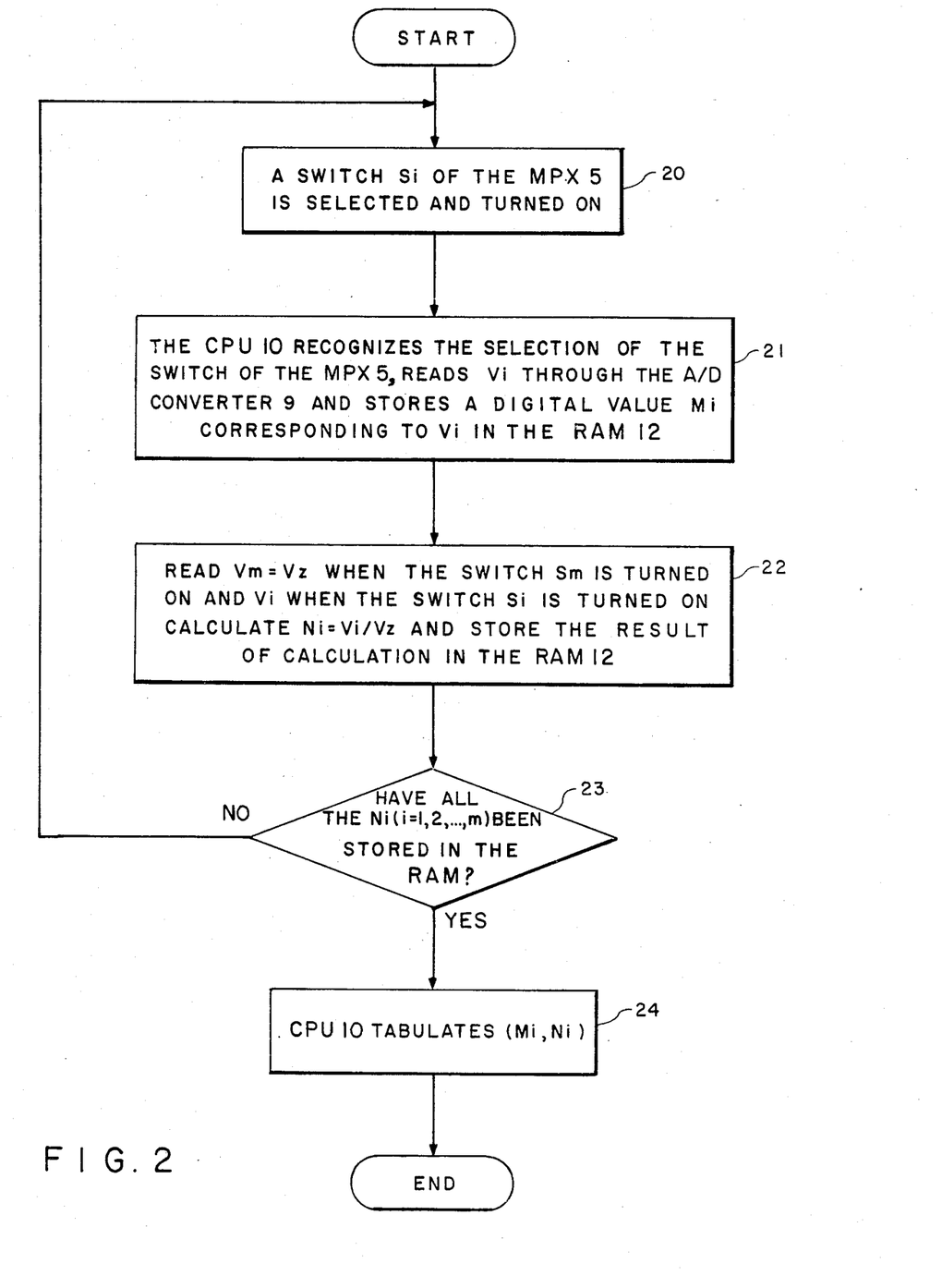
FIG. 2 is a flow chart for previously storing data in the RAM of the circuit shown in FIG. 1, in the adjusting mode.
Figure 3:
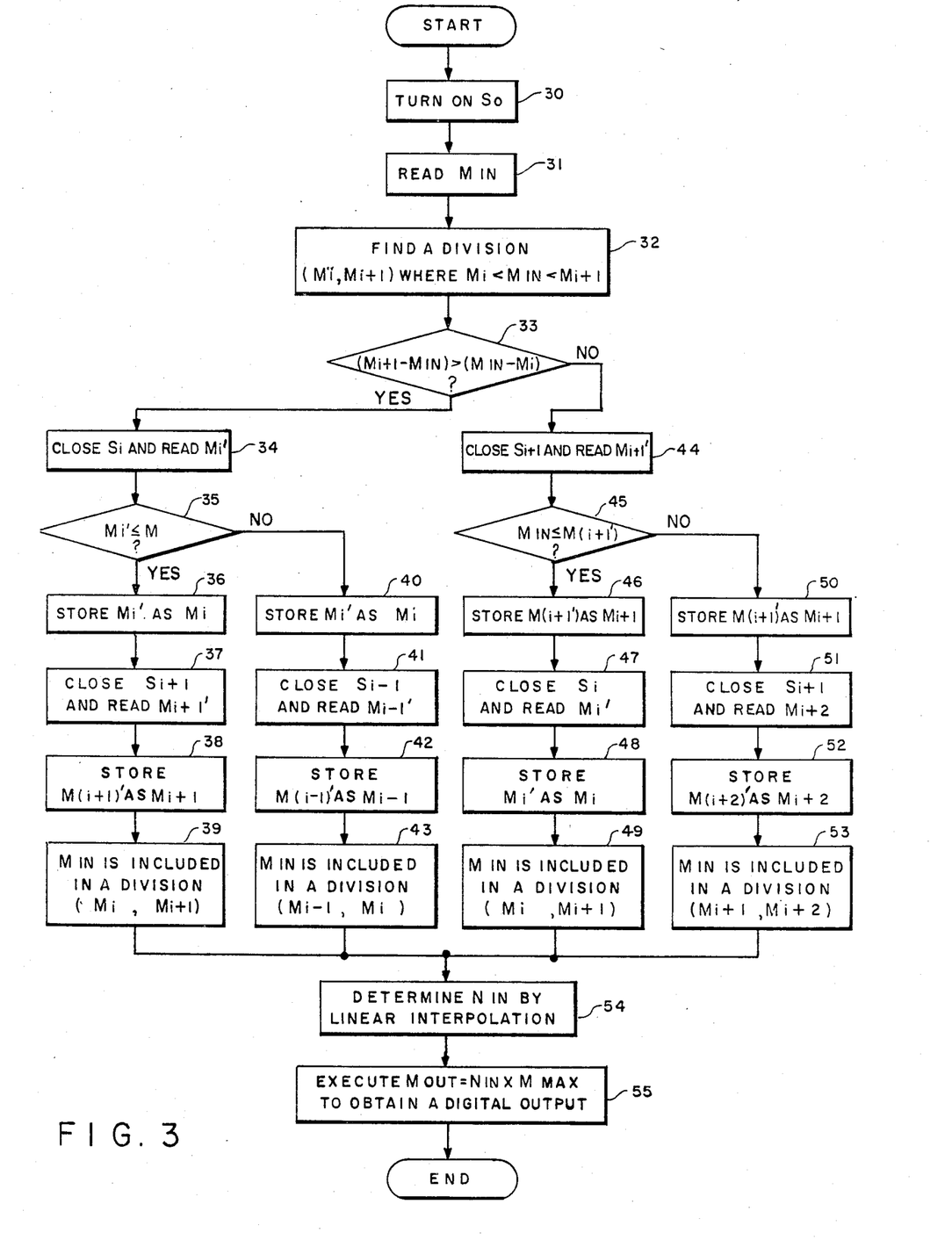
FIG. 3 is a flow chart of a routine of operation of the CPU of the circuit of FIG. 1.
Figure 4:
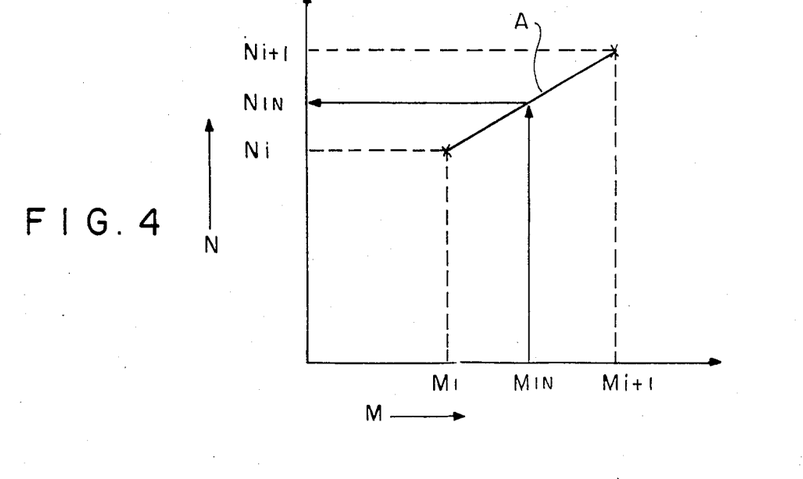
FIG. 4 is a graph explaining linear interpolation.
Figure 5:
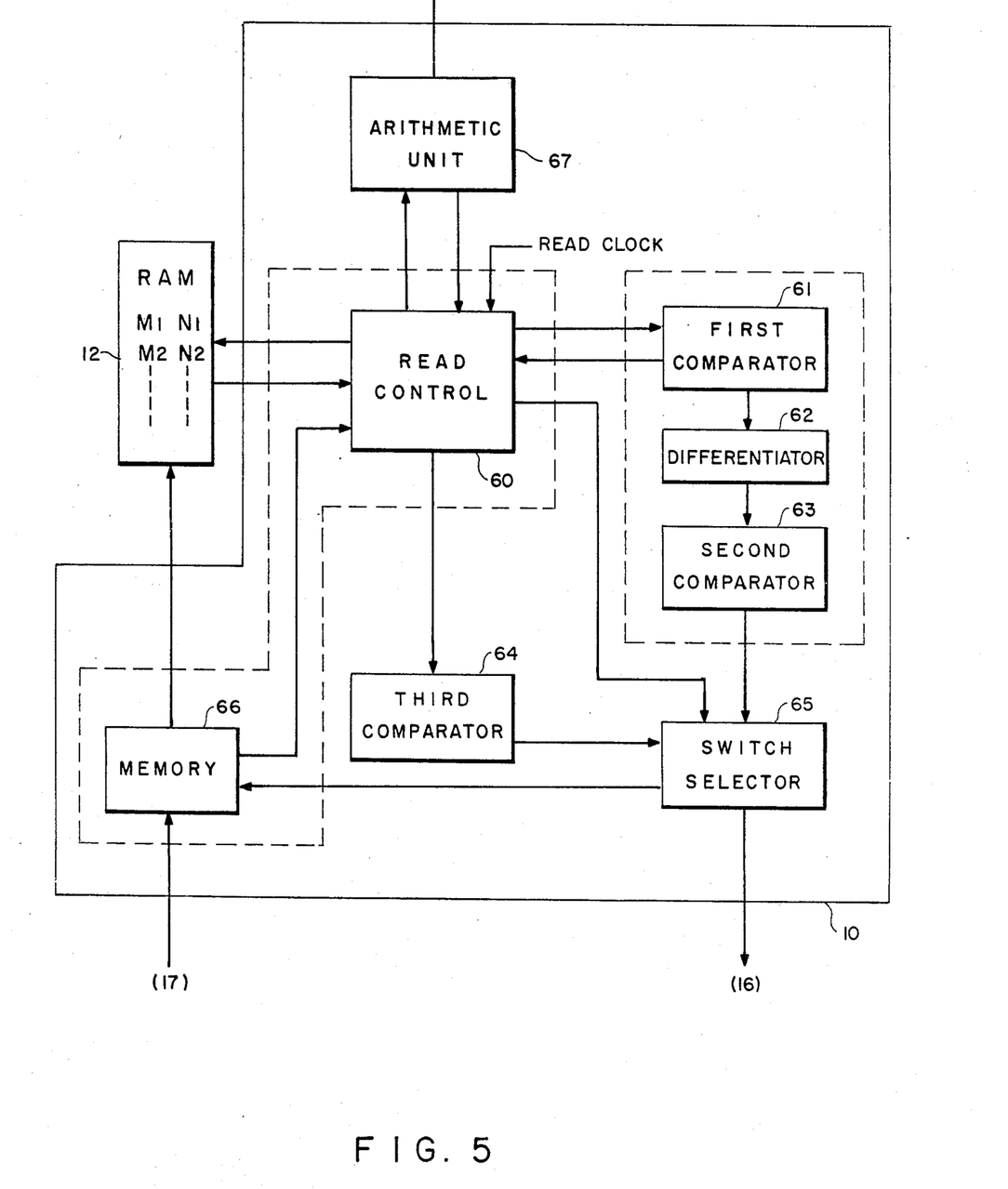
FIG. 5 is a block diagram showing an exemplary functional constitution of the CPU of FIG. 1.

FIG. 2 is a flow chart showing the succession of operations, i.e., steps, in the adjustment mode, FIG. 3 is a flow chart showing the succession of operations to be executed by the CPU 10 for the A/D conversion of the input voltage $V_{in}$, FIG. 4 is a diagram of assistance in explaining the manner of linear interpolation, and FIG. 5 is a block diagram showing an exemplary functional constitution of the CPU 10 and the RAM 12 of FIG. 1. In FIG. 5, there is shown a read control 60 for reading necessary data from the RAM 12, a first comparator 61 for comparing the magnitude of data read by the read control 60, and a differentiator 62 which receives the output signals from the first comparator 61 and calculates the difference of the data. A second comparator 63 receives the outputs of the differentiator 62 and compares the differences in magnitude while a third comparator 64, i.e., a division deciding means, which uses the data read by the read control 60. A switch selector 65 feeds a switch selecting signal according to a decision signal provided by the third comparator 64 through the I/O port 16 to the analog multiplexer 5. A memory 66 receives the digital output signal of the A/D converter 9 through the I/O port 17, stores the digital output signal in the RAM 12 according to the switch selecting signal provided by the switch selector 65, and supplies an address signal indicating the location of the digital output signal in the RAM 12 to the read control 60, and an arithmetic unit 67 which operates on the computational data read from the RAM 12 by the read control 60 according to a predetermined process of computation to provide an actual digital output signal. The read control 60 and the memory 66 constitute a memory control while the first comparator 61, the differentiator 62 and the second comparator 63 constitute a comparing means.

In operation in an adjustment mode, the digital voltmeter 8 and the keyboard 13 are connected to the output terminal 7 and the input terminal 14, respectively. The keyboard 13 is operated to turn on the switches $S_1$ ($i = 1, 2, 3, \ldots, m$) of the multiplexer 5 sequentially each for a predetermined time (Step 20), so that divided voltages $V_i$ ($i = 1, 2, 3, \ldots, m$) are applied sequentially to the digital voltmeter 8 and the A/D converter 9. The CPU 10 recognizes the sequential assignment of the switches $S_1$ of the multiplexer 5 and supplies A/D conversion command signals sequentially to the A/D converter 9 to make the A/D converter 9 execute the sequential A/D conversion of the input divided voltages $V_i$. Digital voltage values $M_1$ ($i = 1, 2, 3, \ldots, m$) corresponding to the input divided voltages $V_1$, respectively, provided by the A/D converter 9 are stored sequentially in the RAM 12. The input divided voltages $V_i$ are read on the digital voltmeter 8. When the switch $S_m$ is closed, an input divided voltage $V_m = V_z$ is read on the digital voltmeter 8. The digital voltage ratios $N_i = V_i/V_z$ ($i = 1, 2, 3, \ldots, m$) are calculated and stored in the RAM 12 by operating the keyboard 13 (Step 11). Steps 20 and 22 are repeated for all the input divided voltages $V_i$. This operation may be controlled by the CPU 10 in a conversational mode. After all the digital voltage ratios $N_i$ have been stored in the RAM 12, the keyboard 13 is operated to give a tabulation command to the CPU 10. Then, the digital voltage values $M_i$ and the voltage ratios $N_i$ stored in the RAM 12 are rearranged sequentially in the RAM 12 to produce a table thereof of ($M_i$, $N_i$). After the adjustment mode has been thus completed, the digital voltmeter 8 and the keyboard 13 are disconnected from the output terminal 7 and the input terminal 14, respectively.

In an A/D conversion mode, an analog input voltage $V_{IN}$ is applied to the input terminal 6. A start signal is given by any suitable means, not shown, to the CPU 10. The CPU supplies a switch selecting signal to the multiplexer 5 to turn on, i.e., close, the switch $S_0$ for a predetermined time (Step 30). Then, the input voltage $V_{IN}$ is converted into a corresponding digital input value $M_{IN}$ by the A/D converter 9 and the digital input value $M_{IN}$ is stored in the RAM 12 (Step 31).

The CPU 10 makes decision as to which of divisions $[M_i, M_{i+1}]$ ($i = 1, 2, 3, \ldots, m$) demarcated in the adjustment mode or in the updated mode, which will be described hereinafter, includes the digital input value $M_{IN}$ (Step 32). In Step 32, the read control 60 reads the digital voltage values $M_0, M_1, \ldots, M_m$ from the RAM 12 in the order of magnitude, for example, from the smallest to the largest. The digital voltage value $M_i$ is compared with the digital input value $M_{IN}$ by the first comparator 61. When $M_{IN} > M_i$, the next digital voltage value $M_{i+1}$ is compared with the digital input value $M_{IN}$. When $M_{IN} < M_{i+1}$, the first comparator means 61 decides that $M_i < M_{IN} < M_{i+1}$, and thereby it is found that a division including the digital input value $M_{IN}$ is a division $[M_i, M_{i+1}]$. The first comparator 61 supplies the digital input value $M_{IN}$, the lower demarcating value $M_i$ and the upper demarcating value $M_{i+1}$ to the differentiator 62. The differentiator 62 calculates differences $|M_{i+1} - M_{IN}|$ and $|M_{IN} - M_i|$ and applies the differences to the second comparator 63. The second comparator means 63 compares the differences (Step 33) to decide whether or not $|M_{i+1} - M_{IN}| > |M_{IN} - M_i|$. When decision at Step 33 is "YES", the digital input value $M_{IN}$ is nearer to the lower demarcating value $M_i$. Then, the switch selector 65 turns on the switch $S_i$ of the multiplexer 5 for a predetermined time, whereby the analog divided voltage $V_i$ is converted into a corresponding digital voltage value $M_i'$ by the A/D converter 9. The digital voltage value $M_i'$ is read by the memory 66 and stored in the RAM 12 (Step 34).

The read control 60 reads the digital voltage value $M_i'$ which has been just stored and the digital input value $M_{IN}$ which has been just stored and the digital input value $M_{IN}$ from the RAM 12 and applies the same to the third comparator means 64. The third comparator means 64 decides whether or not $M_i' \leq M_{IN}$ (Step 35). That is, the decision at Step 32 that the division $[M_i, M_{i+1}]$ includes the digital input value $M_{IN}$ is verified.

When decision at Step 35 is "YES", the updating digital input voltage value $M_I$ is stored as the digital input voltage value $M_i$ in the RAM 12 (Step 36). Upon the reception of the result of decision of the third comparing means 64, the switch selector 65 turns on the switch $S_{i+1}$ of the multiplexer 5 for a predetermined time, and thereby an analog signal $V_{i+1}$ is converted into a corresponding digital value $M_{i+1}'$ by the A/D converter 9. The memory 66 reads the digital value $M_{i+1}'$ and stores the updating digital value $M_{i+1}'$ as the $M_{i+1}$ in the RAM 12 (Steps 37 and 38). When the memory 66 stores the digital values $M_1'$ and $M_{i+1}'$ in the RAM 12, since an assigned address signal is given to the read control means 60, it is known that the digital value $M_{IN}$ is included in the division $[M_i, M_{i+1}]$ (Step 39). In FIG. 4, the digital values M and the digital voltage ratios N are measured on the axis of abscissa and on the axis of ordinate, respectively. The digital voltage ratios $N_i$ and $N_{i+1}$ correspond to digital values $M_i$ and $M_{i+1}$, respectively. Since the digital voltage ratio $N_{IN}$ corresponding to the digital input value $M_{IN}$ is on a straight line A, the digital voltage ratio $N_{IN}$ can be estimated by linear interpolation expressed by:

$$N_{IN} = \frac{N_{i+1} - N_i}{M_{i+1} - M_i} (M_{IN} - M_i) + N_i \quad (1)$$

The read control 60 reads the digital input value $M_{IN}$, the lower demarcating value $M_i$, the upper demarcating value $M_{i+1}$, the digital voltage ratio $N_i$ corresponding to the lower demarcating value $M_i$, and the digital voltage ratio $N_{i+1}$ corresponding to the upper demarcating value $M_{i+1}$, and applies the same to the arithmetic unit 67. The arithmetic means 67 operates the data fed thereto according to equation (1) to provide the digital input voltage ratio $N_{IN}$ (Step 54).

When the decision made by the third comparator 64 at Step 35 is "NO", the digital input value $M_{IN}$ is not included in the division $[M_i, M_{i+1}]$, and a decision is made that the digital input value $M_{IN}$ is included in the preceding division $[M_{i-1}, M_i]$. Then, the updating digital value $M_i'$ is stored as the digital value $M_i$ in the RAM 12 (Step 40). Then, the switch $S_{i-1}$ is turned on for a predetermined time to read the digital value $M_{i-1}'$ from the A/D converter 9 and to store the updating digital value $M_{i-1}'$ as the digital value $M_{i-1}$. Subsequently, a decision is made that the digital input value $M_{IN}$ is included in the division $[M_{i-1}, M_i]$ (Step 43). Then, the digital input voltage ratio $N_{IN}$ is calculated by linear interpolation (Step 54) by the use of:

$$N_{IN} = \frac{N_i - N_{i-1}}{M_i - M_{i-1}} (M_{IN} - M_{i-1}) + N_{i-1} \quad (2)$$

When the decision of the second comparator 63 at Step 33 is "NO", the digital input value $M_{IN}$ is nearer to the upper demarcating value $M_{i+1}$. Upon the reception of the result of decision from the second comparator 63, the switch selector 65 turns on the switch $S_{i+1}$ for a predetermined time. Then, an analog voltage $V_{i+1}$ is converted into a digital value $M_{i+1}$ by the A/D converter 9, and the digital value $M_{i+1}'$ is stored through the memory 66 in the RAM 12 (Step 44). The read control means 60 reads the digital input value $M_{IN}$ and the digital value $M_{i+1}''$ from the RAM 12 and applies the same to the third comparator 64. The third comparator 64 decides whether or not $M_{IN} < M_{i+1}'$ (Step 45) to verify the decision at Step 32 that $M_{IN}$ is included in the division $[M_i, M_{i+1}]$.

When the decision at Step 45 is "YES", the previous decision is correct. The updating digital value $M_{i+1}'$ is stored as the digital value $M_{i+1}$ in the RAM 12 (Step 46). Then, the switch $S_i$ is turned on for a predetermined time to read the updating digital value $M_i'$ provided by the A/D converter 9 and the updating digital value $M_i'$ is stored as the digital value $M_i$ in the RAM 12 (Steps 47 and 48). It is then decided that the digital input value $M_{IN}$ is included in the division $[M_i, M_{i+1}]$ (Step 49). The arithmetic unit 67 calculates the input voltage ratio $N_{IN}$ by the use of equation (1) for linear interpolation (Step 54).

When the decision at Step 45 is "NO", the decision at Step 32 is proved to be wrong. Consequently, it is decided that the digital input value $M_{IN}$ is included to a division $[M_{i+1}, M_{i+2}]$, which is superior to the division $[M_i, M_{i+1}]$. The updating digital value $M_{i+1}''$ is stored as the digital value $M_{i+1}$ in the RAM 12 (Step 50). Then, the switch $S_{i+2}$ is turned on for a predetermined time to make the A/D converter 9 provide a digital value $M_{i+2}'$. The updating digital value $M_{i+2}'$ is stored as a digital value $M_{i+2}$ in the RAM 12 (Steps 51 and 52). It is then decided that the digital input value $M_{IN}$ is included in the division $[M_{i+1}, M_{i+2}]$ (Step 53). The arithmetic unit 67 calculates a digital input voltage ratio $N_{IN}$ corresponding to the digital input value (Step 54) by the use of:

$$N_{IN} = \frac{N_{i+2} - N_{i+1}}{M_{i+2} - M_{i+1}} (M_{IN} - M_{i+1}) + N_{i+1} \quad (3)$$

After a correct digital voltage ratio $N_{IN}$ corresponding to the input voltage $V_{IN}$ has been calculated at Step 54, the read control 60 reads the maximum updating digital value from the RAM 12 and supplies the same to the arithmetic unit 67. The arithmetic unit 67 multiplies the digital input voltage ratio $N_{IN}$ by the maximum updating digital value $M_{MAX}$, and either counts fractions as a whole number or drops fractions to provide a true digital value $M_{OUT}$ corresponding to the input voltage $V_{IN}$. The true digital output $M_{OUT}$ may be stored in the RAM 12 through the operation of the CPU 10 to be read when requested, or may be displayed on a digital display or the like connected through the I/O port 15 to the input terminal 14 through the operation of the CPU 10. The above operations of the A/D conversion mode are repeated for a repetition of each desired A/D conversion.

Figure 6:
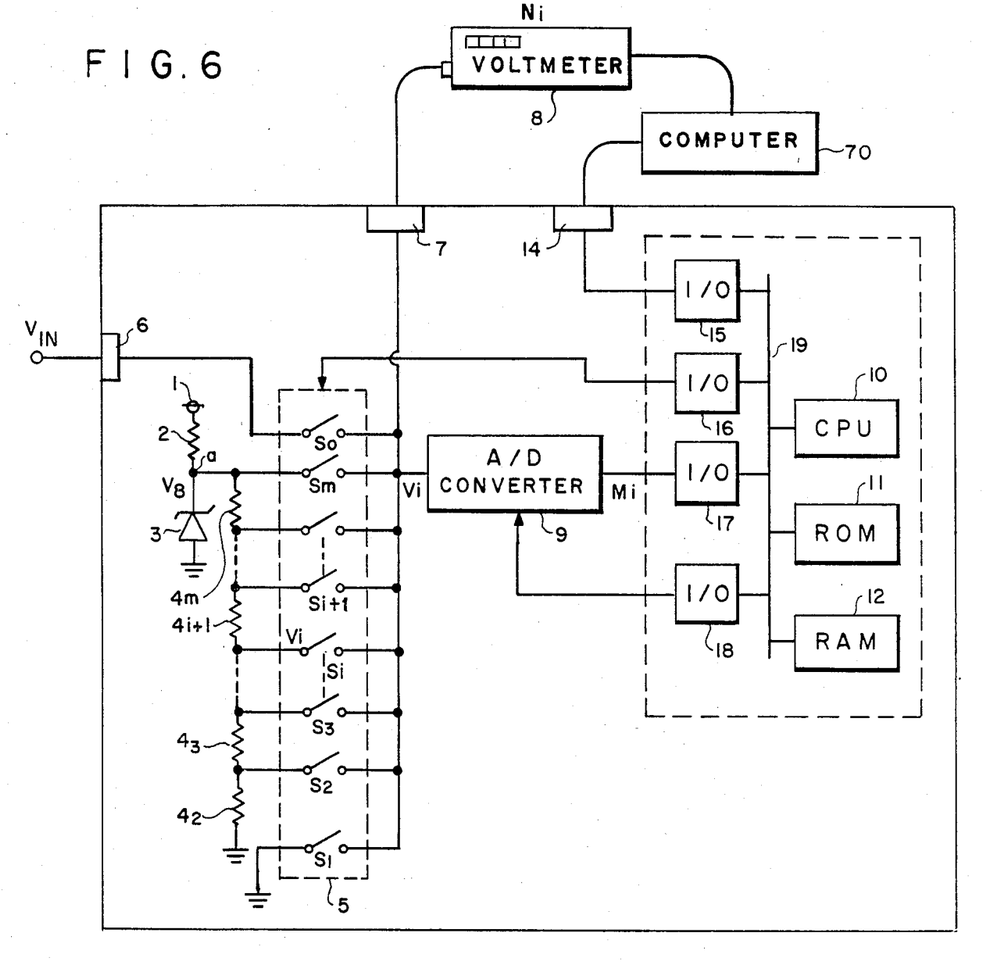
FIG. 6 is block diagram showing an example of a converter system using a second embodiment of the present invention.
Figure 7:
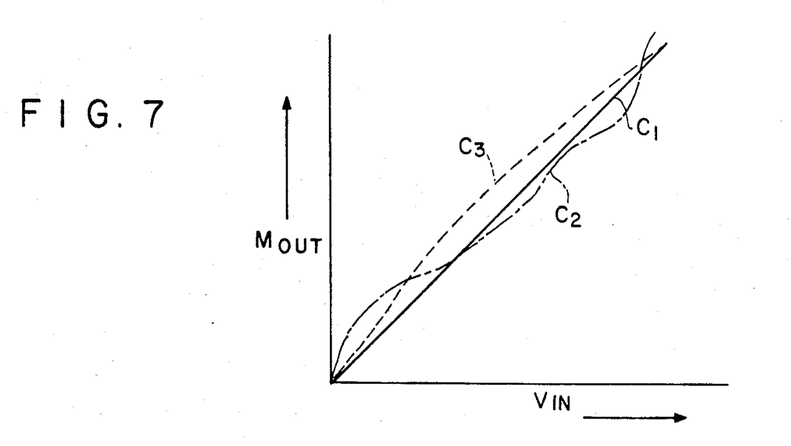
FIG. 7 is a graph showing the input-output characteristics of a conventional A/D converter.

FIG. 6 shows another embodiment of the present invention. Like reference characters designate like or corresponding elements in FIGS. 1, 5 and 6. An external microcomputer 70 operates from the output of the digital voltmeter 8 and feeds the result of operation to the input terminal 14. In the adjusting mode, the microcomputer 70 operates from the outputs of the digital voltmeter 8 and supplies digital volt ratios $N_i$ (i=1, 2, . . . ,m) to a CPU 10. In the first embodiment, an operator is required to calculate each digital voltage ratio $N_i$ and to operate the keyboard 13 to feed the calculated digital voltage ratio $N_i$ to the signal processing unit for storage. In the second embodiment, the adjusting mode is carried out automatically by the microcumputer 70. The rest of the constitution and the manner of operation for A/D conversion of the second embodiment are the same as those of the first embodiment. In the foregoing embodiments, Steps 36 and 40 may be executed in one step between Steps 34 and 35. Similarly, Steps 46 and 50 may be executed in one step between Steps 44 and 45.

In the foregoing embodiments, the digital voltage ratios $N_i$ are stored previously in the RAM 12. However, according to the present invention, it is also possible to store previously a table of combinations of digital values $D_i$ and digital voltage values $M_i$, namely, $[D_i, M_i]$ (i=1, 2, . . . , m) in the RAM 12. In such a case, digital values $D_i$ corresponding to voltages $V_i$ (i=1, 2, . . . m) read on the digital voltmeter are obtained from an A/D input-output characteristics table of ideal A/D conversion linearity prepared beforehand or through the operation of the microcomputer storing the A/D input-output characteristics table, and the digital values $D_i$ are stored in the RAM 12 through the operation of the keyboard or the microcomputer to produce the table of $[D_i, M_i]$ in the RAM 12. Thus, the digital output value $M_{OUT}$ can be directly calculated by linear interpolation. For example, suppose that the digital input value $M_{IN}$ is included in a division $[M_D, M_U]$ and digital values corresponding to $M_D$ and $M_U$ are $D_D$ and $D_U$, respectively. Then, an equation for the linear interpolation is:

$$M_{OUT} = D_{OUT} = \frac{D_U - D_D}{M_U - M_D}(M_{IN} - M_D) + D_D \quad (4)$$

The calculation using equation (4) may be executed in one step instead of Steps 54 and 55. As is apparent from the foregoing description, the deviation of the result of A/D conversion from the linear relation between analog inputs and corresponding digital output can be reduced to the least extent by correcting the result of A/D conversion through linear interpolation even if an inexpensive A/D converter of inferior accuracy is employed. Furthermore, since the digital upper demarcating value and the digital lower demarcating value to be used for linear interpolation are updated for every cycle of A/D conversion, an accurate A/D conversion can be achieved regardless of the effects of time aging and temperature variation on the circuit components.

Accordingly, it may be seen that there has been provided, in accordance with the present invention, an improved A/D conversion method and an A/D converter embodying the method.

The embodiments of the present invention in which an exclusive property or privilege is claimed are defined as follows:

1. An A/D conversion method including the steps of storing digital voltage values obtained through an A/D conversion of divided voltages obtained by dividing an analog voltage in a predetermined voltage range into a predetermined number of different dividing ratios by an A/D converter and digital data for calculating digital output data for the A/D conversion of an input voltage in combination with the digital voltage values in a memory, converting the input voltage into a corresponding digital input value through A/D conversion, deciding upon a voltage division including the digital input value among divisions demarcated by the digital voltage values by sequentially comparing the digital voltage values with the digital input value, deciding which of a pair of the digital voltage values demarcating the division selected through the prior decision is the approximate value of the digital input value, updating the divided voltage corresponding to the digital voltage value through A/D conversion to provide a representative demarcating value, deciding upon a division including the digital input value by comparing the updated representative demarcating value and the digital input value to update one of the divided voltages corresponding to one of the demarcating values paired with the representative demarcating value through A/D conversion, and providing a digital signal corresponding to a digital output value through linear interpolation on the basis of the digital input value, the updated demarcating value, and an appropriate data corresponding to the updated demarcating value of the selected division among the digital data.

2. An A/D converter comprising voltage dividing means which divides an analog voltage in a predetermined range in a predetermined number of different dividing ratios and provides divided output voltages, switch means which provides one of the divided voltages in response to a selection signal, A/D conversion means which converts the analog voltage provided by said switch means into a corresponding digital voltage, switch selecting means for providing the selection signal, memory means for previously storing digital data proportionally corresponding to the divided voltages, respectively, and digital values obtained through the A/D conversion of the divided voltages by said A/D conversion means, memory control means connected to the input side of said switch selecting means, the output side of said A/D conversion means and said memory means, and capable of reading data from said memory means and storing data in said memory means, comparing means connected to said switch selecting means and said memory control means, and capable of selecting a division including the digital input value among divisions demarcated by the digital values by comparing a digital input value obtained through the A/D conversion of the input voltage, and the digital value in magnitude, and capable of deciding which of the upper and lower demarcating values of the selected division is the approximate value of the digital input value, division deciding means connected to said switch selecting means and said memory control means, and capable of deciding a division including the digital input value by comparing the updated demarcating value obtained through A/D conversion by said A/D conversion means on the basis of the prior decision and arithmetic means connected to said memory control means, and capable of providing a digital signal corresponding to a digital output value corresponding to the digital value, calculated through linear interpolation on the basis of a pair of the updated demarcating values of the selected division, and data corresponding to the digital data corresponding to the updated demarcating values.

3. An A/D converter as set forth in claim 2 wherein said voltage dividing means includes a source of a regulated voltage and a plurality of similar resistors connected in series across said source.

4. An A/D converter as set forth in claim 2 wherein said comparing means includes a first comparator, a second comparator, and a differentiator connected between said first and second comparators.

5. An A/D converter as set forth in claim 2 wherein said memory means includes a random-access-memory (RAM).

* * * * *